(12) United States Patent
Sigel et al.

(10) Patent No.: US 9,964,673 B2
(45) Date of Patent: May 8, 2018

(54) OPTICAL SYSTEM WITH APERTURE DEVICE HAVING PLURALITY OF APERTURE ELEMENTS

(75) Inventors: Benjamin Sigel, Aalen (DE); Sascha Bleidistel, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1450 days.

(21) Appl. No.: 13/021,583

(22) Filed: Feb. 4, 2011

(65) Prior Publication Data

US 2011/0194089 A1 Aug. 11, 2011

Related U.S. Application Data

(60) Provisional application No. 61/302,734, filed on Feb. 9, 2010.

(30) Foreign Application Priority Data

Feb. 9, 2010 (DE) .......................... 10 2010 008 222

(51) Int. Cl.
 *G03B 27/72* (2006.01)
 *G02B 5/00* (2006.01)
 *G03F 7/20* (2006.01)

(52) U.S. Cl.
 CPC ........... *G02B 5/005* (2013.01); *G03F 7/7025* (2013.01); *G03F 7/70091* (2013.01)

(58) Field of Classification Search
 CPC ............................ G02B 5/005; G03F 7/7025
 See application file for complete search history.

(56) References Cited

U.S. PATENT DOCUMENTS

| 4,675,590 A | 6/1987 | Pellegrino et al. |
| 6,876,437 B2 | 4/2005 | Kawahara |
| (Continued) | | |

FOREIGN PATENT DOCUMENTS

| DE | 44 47 678 | 11/2000 |
| DE | 10 2009 016456 | 12/2009 |
| (Continued) | | |

OTHER PUBLICATIONS

German Office Action, with English translation, for corresponding DE Application No. 10 2010 008 222.8, dated Sep. 13, 2010.
(Continued)

*Primary Examiner* — Chia-How Michael Liu
(74) *Attorney, Agent, or Firm* — Fish & Richardson P.C.

(57) ABSTRACT

An optical system has an aperture device having a multiplicity of aperture elements for the delimitation of the cross section of a ray bundle running through the optical system. The aperture device has a first aperture element, which is pivotable about a first rotation axis between an engagement position in the beam path of the optical system and a neutral position outside the beam path of the optical system and has a first aperture opening delimited by a first aperture edge. The aperture device also has at least one second aperture element, which is pivotable about a second rotation axis between an engagement position in the beam path of the optical system and a neutral position outside the beam path of the optical system and has a second aperture opening delimited by a second aperture edge. The second aperture opening is smaller than the first aperture opening. The aperture elements pivoted into the engagement position form an effective aperture opening. The aperture edges of aperture elements pivoted into the engagement position do not lie in a common plane.

3 Claims, 6 Drawing Sheets

(56) References Cited

U.S. PATENT DOCUMENTS

| | | |
|---|---|---|
| 6,927,901 B2 | 8/2005 | Mann et al. |
| 7,221,516 B2 | 5/2007 | Mann et al. |
| 8,421,998 B2 | 4/2013 | Shiraishi et al. |
| 2007/0053076 A1 | 3/2007 | Bieg et al. |
| 2007/0211352 A1 | 9/2007 | Phillips et al. |
| 2009/0021820 A1 | 1/2009 | Gellrich et al. |
| 2010/0033699 A1 | 2/2010 | Shirashi |
| 2010/0149509 A1 | 6/2010 | Shiraishi et al. |
| 2012/0075611 A1 | 3/2012 | Bieg et al. |

FOREIGN PATENT DOCUMENTS

| | | |
|---|---|---|
| JP | 2005-521107 | 7/2005 |
| JP | 2007-515772 | 6/2007 |
| JP | 2007-243182 | 9/2007 |
| JP | 2009-253048 | 10/2009 |
| WO | WO 03/081712 | 10/2003 |
| WO | WO 2004/010164 | 1/2004 |
| WO | WO 2005/050322 | 6/2005 |
| WO | WO 2007/105549 | 9/2007 |
| WO | WO 2010/007945 | 1/2010 |

OTHER PUBLICATIONS

Japanese Office Action, with English translation, for corresponding JP Appl No. 2011-025146, dated Nov. 20, 2012.

OPTICAL SYSTEM WITH APERTURE DEVICE HAVING PLURALITY OF APERTURE ELEMENTS

CROSS-REFERENCE TO RELATED APPLICATIONS

This application claims priority under 35 U.S.C. § 119(e)(1) to U.S. Provisional Application No. 61/302,734, filed Feb. 9, 2010. This application also claims benefit under 35 U.S.C. § 119 to German Application No. 10 2010 008 222.8, filed Feb. 9, 2010. The contents of both of these applications are hereby incorporated by reference in its entirety.

FIELD

The disclosure relates to an optical system including an aperture device having a multiplicity of aperture elements for the variable delimitation of the cross section of a ray bundle running through the optical system. The optical system can be, in particular, an optical system of a microlithography projection exposure apparatus, for example a projection objective or an illumination system. One particular field of application is optical systems for microlithography which operate with radiation from the extreme ultraviolet range (EUV).

BACKGROUND

Aperture devices including a multiplicity of aperture elements for the variable delimitation of the cross section of a ray bundle running through an optical system are known, for example, in the form of aperture stops for optical imaging systems. Aperture stops are used to set the numerical aperture—effectively used for an imaging—of the optical system for the corresponding application by virtue of the fact that the cross section of the ray bundle is delimited in a defined manner in the region of a pupil surface of the optical system and the angular spectrum of the rays impinging in the image field is defined thereby. If the optical system is optionally intended to be operated with different numerical apertures, then a variable delimitation of the ray bundle cross section is desired.

Variable aperture devices in the form of iris diaphragms are known which have a plurality of lamellar, generally crescent-shaped aperture elements, which can be jointly rotated inward or outward via a mechanism in order to set the size of the more or less circular effective aperture opening jointly defined by all the lamellae.

Aperture devices are also known which have a plurality of aperture elements which can in each case be moved between an engagement position in the beam path of the optical system and a neutral position outside the beam path of the optical system and in each case have an aperture opening delimited by an aperture edge.

WO 2005/050322 A1 (corresponding to US 2007/0053076 A1) discloses diaphragm changing devices for a projection objective operating with electromagnetic radiation from the extreme ultraviolet range (EUV). The diaphragm changer has a diaphragm store with a plurality of substantially disk-shaped aperture elements which in each case have an aperture openings of fixed shape and size and which can optionally be introduced into an aperture position directly in front of a concave mirror of the projection objective or be removed from this aperture position with the aid of the diaphragm changer. The aperture elements are accommodated within a magazine in separate inserts and, with the aid of a movable robot gripper arm, are removed from the corresponding separate insert, introduced into the beam path and, after they have been used, deposited in the magazine again.

WO 2007/105549 A1 discloses aperture devices having one or a plurality of aperture elements which are in each case pivotable about a rotation axis with the aid of a pivoting drive between an engagement position in the beam path of the system and a neutral position outside the beam path of the optical system and which in each case have an aperture opening of defined form and size delimited by an aperture edge. In the case of embodiments having a plurality of pivotable aperture elements, firstly an aperture element having a larger aperture opening is pivoted into the engagement position and, as desired, subsequently an aperture element having a smaller aperture opening, wherein the aperture element having the larger aperture opening can remain in its neutral position, such that the aperture element having the smaller aperture opening defines the effective aperture opening. The aperture elements having smaller aperture openings in this case each have an outer section and an inner section, which projects conically relative to the outer section and which delimits the smaller aperture opening in this dimension in such a way that it can be introduced into the larger aperture opening in such a way that the smaller aperture opening, in its neutral position, lies in the same plane as the larger aperture opening already lying in the engagement position. The effect of an adjustable planar aperture is thereby achieved with the aid of foldable aperture elements.

A further aperture device including pivotable aperture elements is known from U.S. Pat. No. 4,675,590. The aperture device is part of a laser processing machine and serves for setting the transverse mode distribution of the laser beam in a variable fashion as desired. For this purpose, the aperture device has a stationary aperture element, which is fixedly installed within the laser resonator, and also one or a plurality of aperture elements which can be swung selectively into the beam path of the laser resonator in addition to the stationary aperture element and the aperture openings of which are smaller than the aperture opening of the stationary aperture element. The aperture element respectively swung into the engagement position defines, with its aperture opening, the effective active aperture opening.

SUMMARY

The disclosure provides an aperture device for an optical system with which differently dimensioned aperture openings can be provided in the beam path of the optical system rapidly and with high positioning accuracy. The aperture device is intended to be suitable, in particular, for use in optical systems for microlithography via extreme ultraviolet radiation (EUV), where there are particularly stringent desired properties with respect to cleanness or avoiding contamination in the evacuated region of the beam path. In particular, the aperture device is intended to enable improved optical properties of the optical system with aperture openings of different sizes.

In some embodiments, an optical system includes an aperture device (APD) having a multiplicity of aperture elements for the variable delimitation of the cross section of a ray bundle (RB) running through the optical system. The aperture device includes a first aperture element (AE1), which is pivotable about a first rotation axis (RA1) between an engagement position in the beam path of the optical system and a neutral position outside the beam path of the optical system and has a first aperture opening delimited by a first aperture edge (AR1). The aperture device also includes at least one second aperture element (AE2), which is pivotable about a second rotation axis (RA2) between an engagement position in the beam path of the optical system and a neutral position outside the beam path of the optical system and has a second aperture opening delimited by a second aperture edge (AR2). The second aperture opening is smaller than the first aperture opening. The aperture elements (AR1, AR2) pivoted into the engagement position form an effective aperture opening. The aperture edges of aperture elements pivoted into the engagement position do not lie in a common plane.

When the aperture device is used, the change between a larger effective aperture opening and a smaller effective aperture opening can be achieved by virtue of the fact that, in a manner supplementing the first aperture element already situated in its engagement position, the first aperture element defining the larger aperture opening, at least one second aperture element having a smaller aperture opening is pivoted in, such that the effective aperture opening of the aperture device is then formed by the second aperture opening. Since the aperture edges of the aperture elements pivoted into the engagement position do not lie in a common plane, it is possible, with the aid of the aperture device, to provide a delimitation of the beam path for different aperture widths at different positions along the radiation path. To put it another way, therefore, an aperture device including pivotable aperture elements is provided wherein the position of the effective aperture opening along the radiation path can be altered in a defined manner as a function of the aperture diameter. In comparison with so-called planar aperture devices, in which the effective aperture opening, independently of the aperture diameter, always lies in the same plane or in the same position in the beam path of the optical system, when aperture devices according to the disclosure are used, the effective aperture position, depending on the aperture diameter, can be adapted in a targeted manner to the radiation course in the region of the aperture device. As a result, by way of example, in the case of optical systems having a so-called aperture aberration or an aperture curvature, it is possible to obtain improved optical properties in the case of different aperture openings. Furthermore, if appropriate, it is possible to reduce or avoid vignetting problems when stopping down.

The aperture device can have exactly two pivotable aperture elements, such that it is possible to obtain two different positions of the effective aperture opening with different aperture diameters and/or different forms of the aperture opening. In some embodiments, the aperture device has at least three pivotable aperture elements, for example three, four, five, six or more separate aperture elements. A finely graduated adaptation of the effective aperture opening to the conditions of use of the optical system is possible as a result.

Two or more pivotable aperture elements, e.g. three, four or five aperture elements, can be pivotable about coaxial rotation axes. Preferably, all the pivotable aperture elements of an aperture device are pivotable about the same rotation axis. For this purpose, it is possible to provide a common pivoting drive, such that precise driving of the aperture elements is possible in conjunction with a space-saving simple construction.

In some embodiments, the aperture edges of the aperture elements pivoted into the engagement position lie on a common surface curved in at least one direction, for example on a rotationally symmetrical surface, in particular on a spherically or conically curved surface. In this way, with the aid of foldable or pivotable aperture elements, it is possible to realize e.g. so-called spherical apertures (in the case of a spherically curved surface) or conical apertures (in the case of a conically curved surface). The curved surface defined by the aperture edges can also have an asymmetrical surface form, that is to say that a surface curved freely in space is involved. In the case of high aspect ratios of image aberrations, that is to say in the case of a large difference between height and width of the image field, such as occur in EUV microlithography, for example, the common curved surface can also be a cylindrical surface, for example, wherein the curvature preferably runs along the long side of the image field.

In the case of the aperture device, an aperture element having a relatively larger aperture opening can remain in its pivoted-in engagement position if, upon changing from a larger aperture opening to a smaller aperture opening, a second aperture element having a comparatively smaller aperture opening (or even further aperture elements having even smaller aperture openings) is (are) pivoted from the respective neutral position thereof into the respective engagement position thereof. In this case, the aperture elements pivoted into the engagement position can form a stack of aperture elements, wherein the aperture element having the relatively smaller aperture opening is in each case supplementarily pivoted in from a first side of the aperture element having a relatively larger aperture opening.

Different directions of the offset between larger and smaller aperture openings are possible. As a result, the curved surface defined by the aperture edges of the aperture elements pivoted into the engagement position can optionally have a substantially convex or a substantially concave curvature.

For clarification purposes, that side of the aperture element having a larger aperture opening which faces the aperture element having a smaller aperture opening shall be designated as first side and the side facing away from the aperture element having a smaller aperture opening shall be designated as second side of the first aperture element having a larger aperture opening. In some embodiments, the relatively small inner aperture openings are situated in a manner offset in relation to the respectively larger aperture opening toward the first side, that is to say toward the side from which the aperture element having a smaller aperture opening is pivoted to supplement the aperture element having a larger aperture opening. As a result, the smaller aperture openings in each case lie on that side of the relatively larger aperture openings on which the supplementarily pivoted-in aperture elements having smaller aperture openings also lie. Such a curvature can be realized in a simple manner with the aid of substantially plate-shaped or disk-shaped aperture elements having aperture openings of different sizes.

An opposite curvature of the surface defined by the aperture edges of the aperture elements pivoted into the engagement position is also possible. For this purpose, in some embodiments the second aperture element has an outer section and an inner section, which directly adjoins the aperture opening and which projects relative to the outer section and can be led through the first aperture opening in such a way that the second aperture opening delimited by the inner section of the second aperture element is arranged on that side of the first aperture element which lies opposite the outer section of the second aperture element, beyond the first aperture opening. The projecting inner section can have a conical shape, for example, such that even a ray bundle having different ray angles can pass through the second aperture opening without vignetting at the second aperture element.

The arrangement and orientation of the rotation axes for the aperture elements can be adapted to the installation situation at the optical system. In one embodiment, the first and second rotation axes are situated in a coaxial fashion, such that the first aperture element and the second aperture element are pivotable about the same rotation axis. In particular, the rotation axes of all the pivotable aperture elements of the aperture device (e.g. three, four, five, six or more aperture elements) can be situated in a coaxial fashion. They can then be pivoted via a single common drive in a particularly simple manner.

However, the first and second rotation axes can also be situated at different locations and/or be oriented differently. By way of example, the second rotation axis can be situated parallel in an offset fashion with respect to the first rotation axis, in particular on the side lying opposite the first rotation axis relative to the passage direction of the beam bundle. The aperture elements can then be pivoted into their respective engagement position from different sides of the ray bundle. It is also possible for the first and second rotation axes to be oriented at an angle with respect to one another, in particular at a right angle. By way of example, two aperture elements can be pivoted in or pivoted out from directions offset by 90° with respect to one another.

Generally, the rotation axis of an aperture element lies parallel to a plane defined by the respective aperture opening. This is not mandatory, however. Rather, it is also possible for the rotation axis to be at an angle with respect to a plane defined by the aperture opening. By way of example, the rotation axis can be perpendicular to the plane defined by the aperture opening.

Preferably, the aperture device is arranged along the beam path at a position at which rays of the ray bundle have a finite aperture, that is to say different ray angles, such that the aperture device lies in the region of a non-parallel beam path. By way of example, the optical system can have an entrance surface, an exit surface and at least one pupil surface arranged between the entrance surface and the exit surface, and the aperture device can be arranged at or in the vicinity of the pupil surface. In this way, the aperture device can be used as an aperture stop (aperture diaphragm). The aperture device can, if appropriate, also be arranged in the region of a very substantially parallel beam path.

The aperture device can be positioned in such a way that the aperture elements pivoted into the engagement position lie in the region of the single beam passage of the ray bundle. This position can lie e.g. optically between two mirrors or between a lens and a mirror or between two lenses. In some embodiments, the optical system has at least one mirror having a mirror surface, wherein the aperture device is arranged in the vicinity of the mirror in such a way that the effective aperture opening is arranged in the region of the double beam passage in front of the mirror surface. In this way, both the radiation directed onto the mirror surface and the radiation reflected from the mirror surface can pass through the effective aperture opening. It may then be favorable, for example, if the mirror lies at or in the vicinity of a pupil surface of an optical system and the aperture device is used as an aperture stop.

It may be particularly favorable if the mirror surface has a convex or concave curvature, and if a curved surface defined by the aperture edges of the aperture elements pivoted into the engagement position is adapted to the curvature of the mirror surface. The effective aperture opening can thereby lie in suitable proximity to the mirror surface in the case of any aperture diameter, such that vignetting problems can be avoided to the greatest possible extent.

Particularly when the aperture device is arranged in the region of double beam passage, when aperture elements having circular aperture openings are used, vignetting of the ray bundle can occur on the path of the incident rays to the mirror and/or on the path of the reflected rays from the mirror. In some embodiments, this problem is avoided by virtue of the effective aperture opening having a non-round form deviating from the circular form. The aperture opening can be shaped in an oval or elliptic fashion, for example.

Apertures having an elliptical aperture edge and apertures whose ellipticity can be altered as a function of the aperture diameter are known, for example, from WO 2004/010164 in the name of the present applicant for the area of catadioptric projection objectives. U.S. Pat. No. 7,221,516 B2 discloses an aperture device for a projection objective for EUV microlithography wherein the aperture opening has a non-round form in order to avoid vignetting problems. An aperture device including pivotable aperture elements of the type described here can be used instead of the aperture devices described therein. In this respect, the disclosure of WO 2004/010164 and of U.S. Pat. No. 7,221,516 B2 is incorporated by reference in the content of this description.

These and further features emerge not only from the claims but also from the description and the drawings, wherein the individual features can in each case be realized by themselves or as a plurality in the form of subcombinations in an embodiment of the disclosure and in other fields and can constitute advantageous and inherently protectable embodiments. Exemplary embodiments are illustrated in the drawings and are explained in greater detail below.

DETAILED DESCRIPTION OF THE PREFERRED EMBODIMENTS

Figure 1:
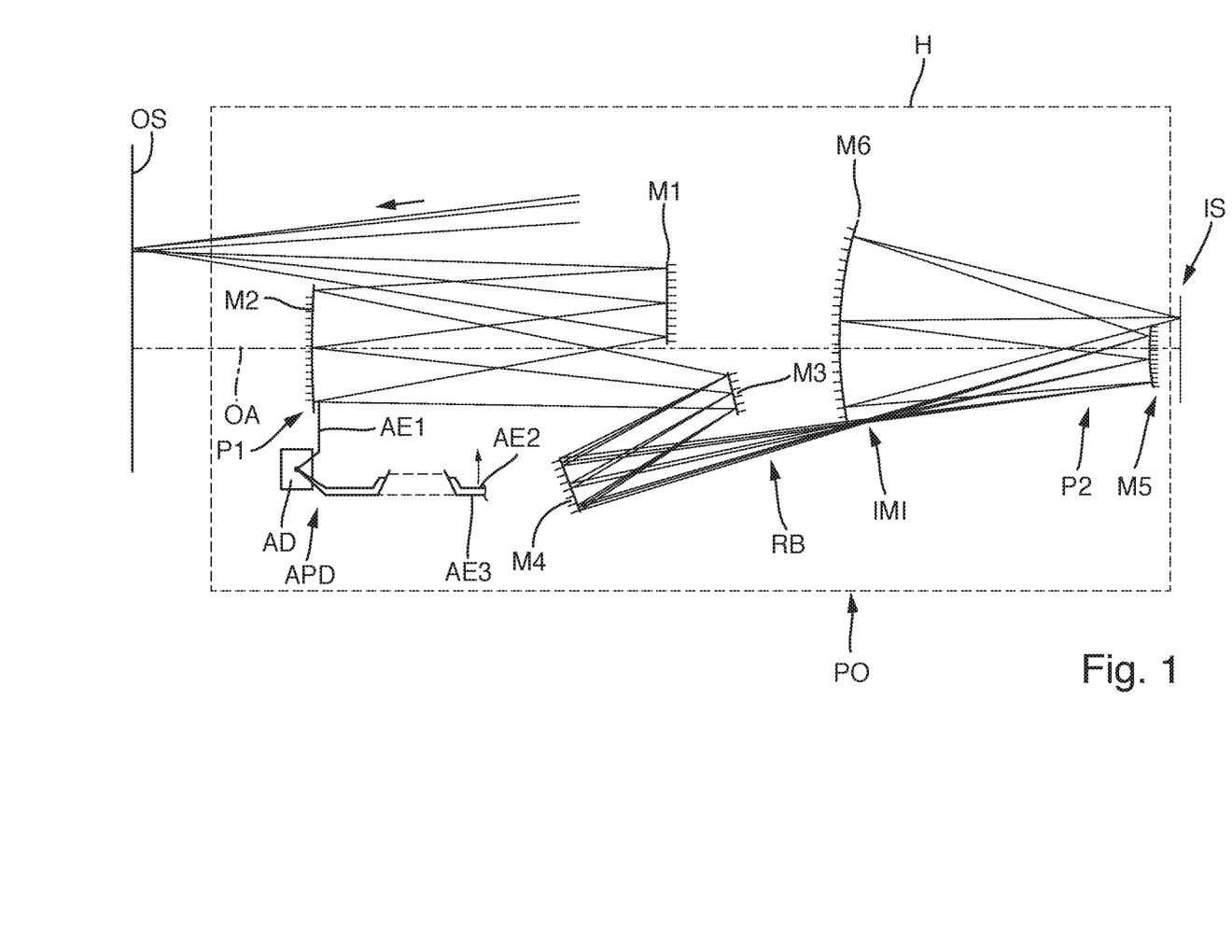
FIG. 1 shows a meridional section through an EUV projection objective with an embodiment of an aperture device including foldable aperture elements.

A typical construction of an EUV projection objective PO is shown on the basis of a preferred exemplary embodiment in FIG. 1. It serves for imaging a pattern of a reticle or the like, arranged in an object plane OS, into an image plane IS, oriented parallel to the object plane, on a reduced scale, for example with the ratio 4:1. The imaging is effected via electromagnetic radiation from the extreme ultraviolet range (EUV) in particular at an operating wavelength of approximately 13.4 nm. This radiation is also designated hereinafter as "light" for short.

The optical system formed by the projection objective has exclusively reflective optical elements (mirrors) for influencing the ray bundle. Between the object plane OS and the image plane IS, a total of six mirrors M1 to M6 which are provided with curved mirror surfaces and are thereby imaging are arranged coaxially with respect to one another in such a way that they define a common optical axis OA, which is perpendicular to the image plane and the object plane. The reflective mirror surfaces of the mirrors M1 to M6 have the form of rotationally symmetrical aspheres, the axis of symmetry of which coincides with the common mechanical axis OA.

In this example, the object is a mask (reticle) having the pattern of an integrated circuit, but a different pattern, for example of a grating, can also be involved. In the example, the image is formed on a wafer, which serves as a substrate and is provided with a photoresist layer, but other substrates, for example elements for liquid crystal displays or substrates for optical gratings, are also possible.

The ray bundle RB running between object surface OS and image surface IS during projection is depicted on the basis of selected beams in FIG. 1. The light from an illumination system (not shown) including a light source for soft X-ray radiation impinges, from the image-facing side of the object plane OS, firstly on the reflective mask M arranged in the object plane OS. The reflected light impinges on a first mirror M1, which has a concave mirror surface directed toward the object, the mirror surface reflecting the impinging radiation onto a second mirror M2 in a slightly constricted fashion. The second mirror M2 has a concave mirror surface facing the first mirror M1, the mirror surface reflecting the radiation in the direction of a third mirror M3 as a convergent ray bundle. The third mirror M3 has a convex mirror surface, which reflects the radiation impinging in an off-axis fashion in the direction of a concave mirror surface of a fourth mirror M4. The latter is used in a mirror region far outside the optical axis and reflects the impinging radiation with formation of a real intermediate image IMI onto a fifth mirror M5, arranged in the vicinity of the image plane IS. The fifth mirror has a convex mirror surface facing away from the image plane, the mirror surface reflecting the impinging divergent radiation in the direction of a sixth mirror M6, which has a concave mirror surface facing toward the image plane IS, the mirror surface reflecting the impinging radiation and focusing it onto the image plane IS.

All the mirrors M1 to M6 are accommodated within an evacuatable housing H, the housing wall of which is represented by dashed lines in FIG. 1.

All the reflecting surfaces of the mirrors M1 to M6 are covered with reflection-increasing reflection coatings. Preferred embodiments involve layer stacks of, for example, approximately forty alternate layer pairs, wherein an alternate layer pair in each case includes a silicon layer and a molybdenum layer.

The projection objective can be constructed, for example, in accordance with the specification of the projection objective disclosed in U.S. Pat. No. 6,927,901 B2. In this respect, the disclosure of U.S. Pat. No. 6,927,901 B2 is incorporated by reference in the content of this description. The six-mirror system designed for step-and-scan operation operates with an off-axis annular field, and achieves a numerical aperture of NA=0.25 given a typical field size of 2×26 mm$^2$.

The optical imaging between the planar object surface OS and the planar image surface IS optically conjugate with respect thereto takes place in two stages with generation of a single real intermediate image IMI. In this case, a first objective part, including the first mirror M1, the second mirror M2, the third mirror M3 and the fourth mirror M4, generates the intermediate image IMI with an imaging scale of close to −1. The intermediate image is then imaged onto the image plane IS on a demagnified scale with the aid of a second objective part, formed by the fifth mirror M5 and the sixth mirror M6. Between the object surface OS and the intermediate image, a first pupil surface P1 lies in direct proximity to the concave mirror surface of the second mirror M2. The second pupil surface P2 between the intermediate image IMI and the image surface IS lies geometrically and optically between the fifth and sixth mirrors.

Figure 5:
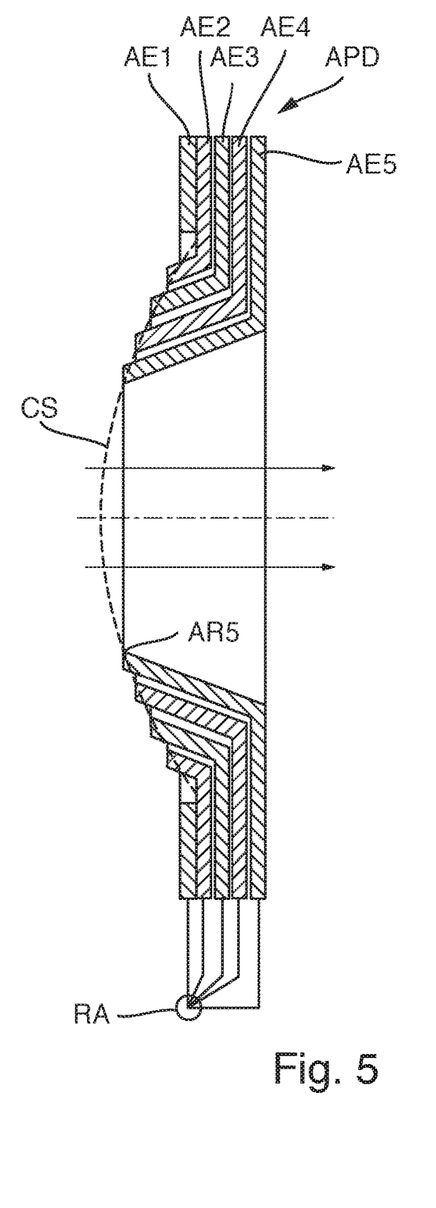
FIG. 5 shows an aperture device including five pivotable aperture elements which are arranged in the engagement position in the region of single beam passage.

An aperture device APD is arranged in the region of the first pupil surface P1, the aperture device serving as an aperture stop having an aperture opening that can be set in a variable fashion, in order to set the image-side numerical aperture actually used during the projection. The aperture device APD is also illustrated in a different schematic view in FIG. 2, and a variant that can likewise be used, including more aperture elements, is shown in FIG. 5.

The aperture device has a first aperture element AE1, which is pivotable via a pivoting drive AD about a first rotation axis RA1 between the engagement position—illustrated in FIG. 1—in the beam path of the optical system and a neutral position outside the beam path. The first aperture element has a round first aperture opening, which is delimited by a first aperture edge AR1. In the engagement position of the aperture element, the aperture edge acts as the light-determining edge of the aperture element in such a way that all rays passing through the aperture opening on the outgoing path to the concave mirror and on the return path from the concave mirror can contribute to the imaging, while rays which impinge either on the outgoing path to the concave mirror or after reflection at the latter on the return path from the concave mirror outside the opening are blocked.

Furthermore, the aperture device has a second aperture element AE2, which is pivotable via the same pivoting drive AD about a second rotation axis RA2, which is coaxial with the first rotation axis RA1, between an engagement position which in the beam path of the optical system and a neutral position outside the beam path. The second aperture element has a second aperture opening, which is delimited by a second aperture edge AR2 and which is smaller than the first aperture opening. In the case of circular aperture openings, the size thereof can be defined by the diameter of the aperture opening, wherein, in the case of the example, the diameter of the second aperture opening is then significantly less than the diameter of the first aperture opening. Usually, the diameter of the second aperture opening is less than 95% of the diameter of the first aperture opening. The second aperture element AE2 is shown in its neutral position lying outside the beam path in FIG. 1.

Furthermore, the aperture device has a third aperture element AE3, which is pivotable via the same pivoting drive AD about a third rotation axis RA3, identical to the first rotation axis RA1 and the second rotation axis RA2, between an engagement position in the beam path of the optical system and a neutral position outside the beam path. The third aperture element has a third aperture opening, which is delimited by a third aperture edge AR3 and which is smaller than the second aperture opening and significantly smaller than the first aperture opening. The third aperture element AE3 is shown in its neutral position in FIG. 1 and in its engagement position in FIG. 2.

The rotation axes RA1, RA2 and RA3 in each case lie parallel to the aperture plane defined by the associated aperture opening and in the installation state of the aperture device perpendicular to the optical axis OA of the projection objective.

Figure 4:
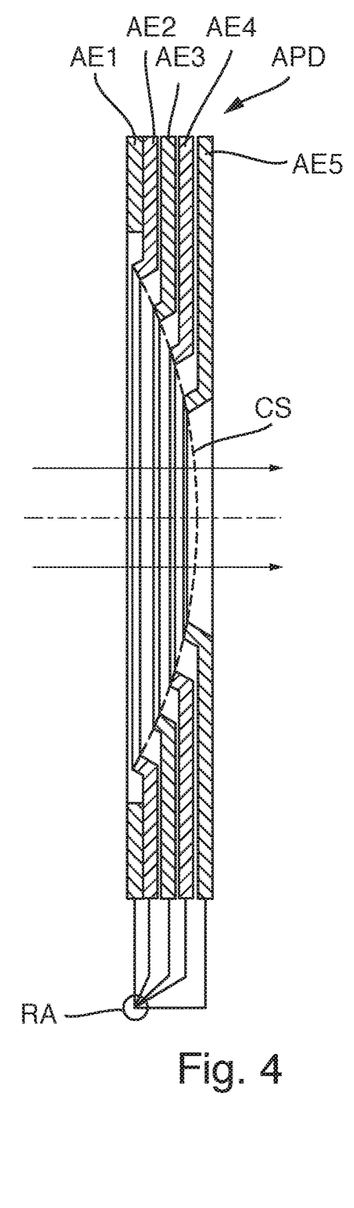
FIG. 4 shows an aperture device including five pivotable aperture elements which are arranged in the engagement position in the region of single beam passage.

Other embodiments have only two pivotable aperture elements. It is also possible to provide more than three pivotable aperture elements, for example four or five (as illustrated in FIGS. 4 and 5) or more.

Figure 6:
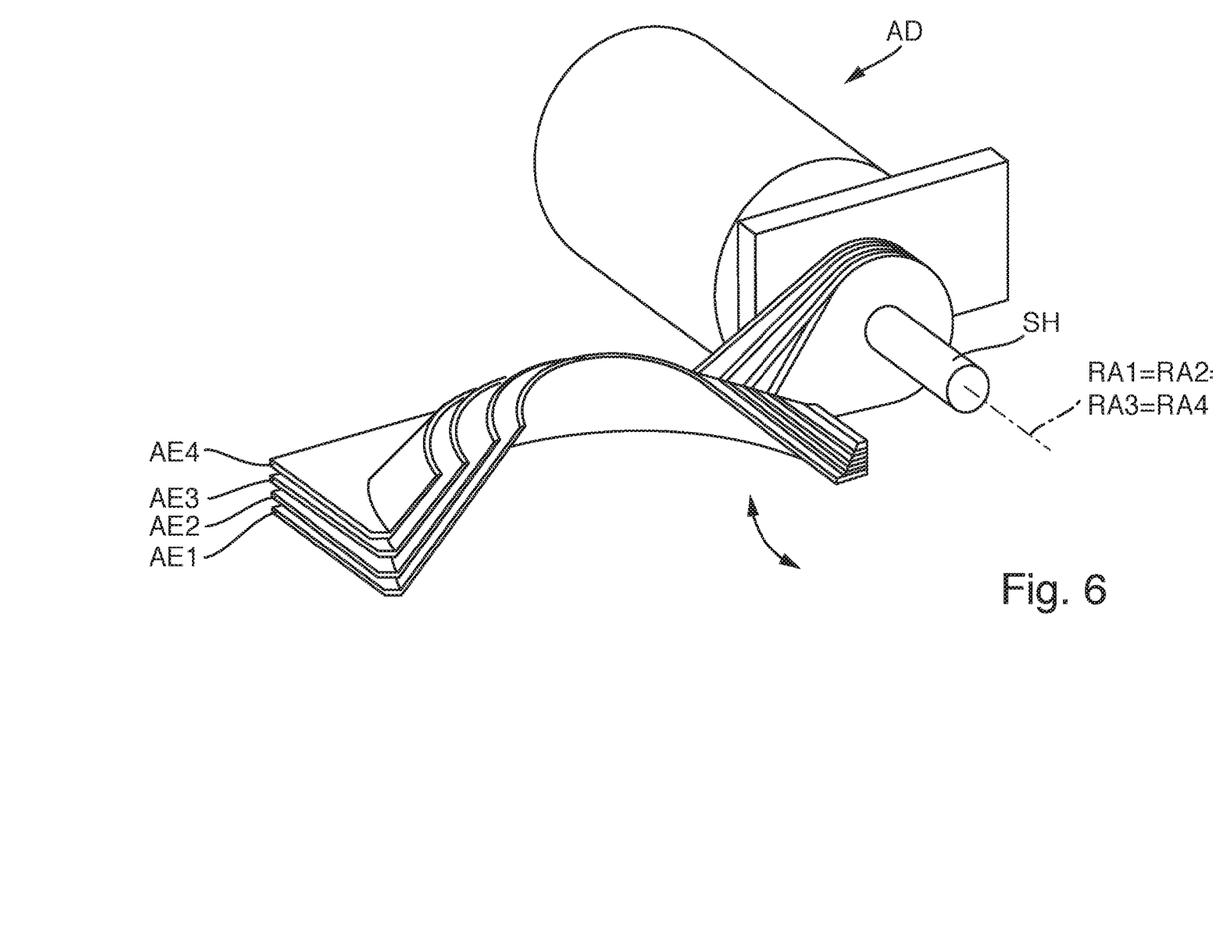
FIG. 6 shows an aperture device including four pivotable aperture elements which are pivotable about the same rotation axis via a common pivoting drive.

In a manner similar to that in the case of the embodiment in FIG. 6, wherein the aperture device has four pivotable aperture elements, all the movable aperture elements are driven by a single, common pivoting drive AD, which can contain, for example, an electric motor driven by the controller of the projection exposure apparatus. The aperture elements are mounted jointly on the output shaft SH of the electric motor in such a way that, upon rotation of the shaft in one direction, all the aperture elements can be pivoted with temporal spacing successively in their engagement position, while upon rotation of the motor shaft in the opposite direction, the aperture elements are pivoted with spacing successively into the neutral position. For this purpose, a suitable driver device is present on the shaft. The construction can be oriented, for example, toward driving devices such as are known from the transmission technology of shift transmissions.

Figure 2:
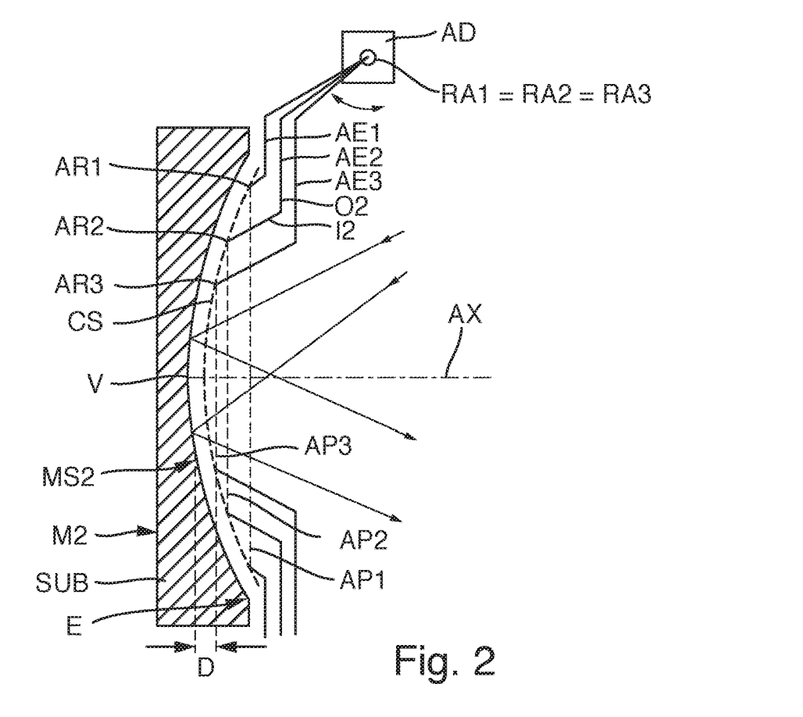
FIG. 2 shows an aperture device including pivotable aperture elements which are arranged in the engagement position in the region of double beam passage in front of a concave mirror.

As can be discerned particularly well in FIG. 2, the aperture edges AR1, AR2 and AR3 of the aperture elements AE1, AE2 and AE3 pivoted in their engagement position lie on a common curved surface CS illustrated in a dashed fashion, which, in the case of the example, is a spherical surface, that is to say a spherically curved surface. This is achieved by virtue of the fact that the aperture edges of the aperture elements pivoted into the engagement position do not lie on a common plane, but rather are offset relative to one another parallel to the direction AX, wherein the direction AX can coincide with the optical axis OA. To put it more precisely, the first aperture edge AR1 defines a first aperture plane AP1, the second aperture edge AR2 defines a second aperture plane AP2, and the third aperture edge AR3 defines a third aperture plane AP3, wherein the aperture planes in each case lie parallel to one another. The effective aperture opening that is active during imaging is in each case determined by the smallest of the aperture openings situated in the engagement position, that is to say by the third aperture opening in the case of the example concerning FIGS. 1 and 2.

As can be discerned well in FIGS. 1 and 2, the aperture elements pivoted into the engagement position lie in the vicinity of the reflected mirror surface MS2 of the mirror M2 in such a way that the effective aperture opening lies in the region of double beam passage in front of the mirror surface. In order that a ray of the ray bundle can contribute to the imaging, both that part of the ray which is incident from the first mirror M1 in the direction of the second mirror M2 and that part of the ray which is reflected from the second mirror M2 in the direction of the third mirror M3 passes through the effective aperture opening. If rays which lie at the edge of the ray bundle and are actually desired for the imaging are trimmed on the outgoing path to the mirror or on the return path from the mirror through the aperture, then this is referred to as vignetting, which is generally undesirable. If, for example, a planar aperture having a variable aperture opening were installed in front of the concave mirror M2, then the problem of vignetting would tend to increase, the smaller the effective aperture opening set.

Such problems are avoided to the greatest possible extent via the particular configuration of the aperture device in that the aperture elements pivoted into the engagement position, or the aperture edges of the aperture elements, define a curved surface CS which is identical or adapted to the curvature of the mirror surface MS2. In the case of the example, the common surface CS defined by the aperture edges has a curvature adapted to the concave curvature of the mirror surface MS2 and having a more or less identical radius of curvature, such that the distance D—measured parallel to the axis AX—between a pivoted-in aperture edge and the mirror surface, independently of the associated diameter of the aperture opening, for all the aperture elements, is identical or substantially the same. The distance can be, depending on the diameter of the mirror surface, for example, of the order of magnitude of one or two or three or four millimeters. In the case of diameters of the mirror surface of 10 cm to 50 cm, the distance D can be, for example, between 1% and 5% of the diameter of the mirror surface. In the case of the example of the concave mirror M2 in FIG. 2, the aperture openings of all the aperture elements pivoted into the engagement position lie between a plane defined by the physical edge E of the concave mirror and the vertex V of the concave mirror.

When pivotable aperture elements are used, such an advantageous arrangement of the respectively effective aperture opening in direct proximity to the mirror surface cannot be achieved without particular structural measures, since the aperture elements have to be folded from the reflective side of the mirror toward the latter or away from the latter and since, at the same time, the aperture element having the largest aperture opening has to be pivoted into its engagement position in the vicinity of the mirror first in the order of the pivotable aperture elements. In order nevertheless to achieve the adaptation of the common surface CS to the mirror curvature, the second aperture element (that is to say the one having the relatively smaller aperture opening) in each case has an outer section O2 and an inner section I2, which directly adjoins the second aperture opening and which projects relative to the outer section O2 in the direction of the common surface CS and can be led through the relatively larger first aperture opening in such a way that the second aperture opening delimited by the inner section I2 of the second aperture element lies on that side of the first aperture element AE1 which lies opposite the outer section O2 of the second aperture element AE2 beyond the first aperture opening or aperture plane AP1. To put it another way, the second aperture opening delimited by the inner section I2 of the second aperture element AE2 can be arranged relative to the first aperture opening in a manner lying opposite the outer section O2, that is to say on the other side of the first aperture opening. The smaller aperture opening is therefore moved in the direction of the mirror through the next larger aperture opening closer to the mirror.

As can also be discerned particularly well in FIG. 6, the respective outer section can substantially have the form of a plate parallel to the associated aperture opening. By contrast, the adjacent inner section is embodied in the form of a truncated cone which, with its wider end, is adjacent to the outer section and, with its tapered end, delimits the associated aperture opening. The cone angle of the conical section can be adapted to the beam path of the optical system, that is to say to the course of the beam bundle, in such a way that no beams are incident on the inner side of the inner section or even on the outer section, rather that that end of the inner section which is smaller in diameter forms the light-determining edge, that is to say the effective aperture edge. Furthermore, the distance between the rotation axis of the respective aperture elements and the inner section thereof and the relative position thereof should be dimensioned such that when the aperture element having the respectively smaller aperture opening is pivoted in or pivoted out, this does not collide with the aperture element having the larger aperture opening that is already situated in the engagement position.

Figure 3:
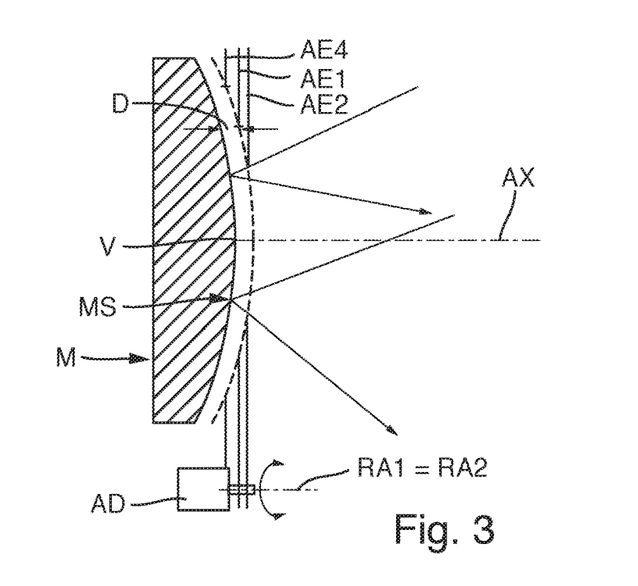
FIG. 3 shows an aperture device including pivotable aperture elements which are arranged in the engagement position in the region of double beam passage in front of a convex mirror.

FIG. 3 shows an exemplary embodiment of an aperture device APD, the pivotable aperture elements of which are arranged in their engagement position directly in front of the convexly curved mirror surface MS of a convex mirror M. As in the embodiment in FIG. 2, the aperture edges of the aperture elements situated in the engagement position lie on a common spherical surface CS, the radius of curvature of which substantially or exactly corresponds to the radius of curvature of the convex mirror surface MS. In this case, too, the axially parallel distance D between the aperture edges of the aperture elements situated in the engagement position and the mirror surface, in the case of all the aperture elements, independently of the aperture diameter thereof, is substantially the same and the distance is dimensioned to be small enough that vignetting problems are avoided to the greatest possible extent, independently of the diameter of the effective aperture opening. A special feature of the aperture device in FIG. 3 is that the first aperture element AE1 and the second aperture element AE2 lie with their aperture edges in each case in planes which lie on the reflective side of the mirrors at a distance in front of the vertex V of the mirror. This allows a structurally simple construction of the aperture elements in the form of disks which are perforated in their center and which can be moved perpendicularly to the axis AX of rotational symmetry of the concave mirror, without colliding with the mirror. Therefore, in the case of this example, the coaxial rotation axes RA1 and RA2 of the aperture elements are oriented perpendicularly to the planes defined by the aperture opening or parallel to the axis AX, such that the aperture element not required in each case can be pivoted out of the beam path or pivoted into the beam path in a pivoting plane perpendicular to the axis AX.

Pivoting to the side is not possible in the case of the example for the aperture element AE4 lying closest to the convex mirror, since the plane defined by the aperture edge of the aperture element intersects the convex mirror surface. For this aperture element, in a manner similar to that for the embodiment in FIG. 2, it is possible to provide pivoting which runs perpendicularly to the axis AX and which can be realized via the same pivoting drive AD by way of a suitable deflection or by a separate drive.

In the examples in FIGS. 2 and 3, the rotation axes which are associated with the respective aperture elements and about which the pivoting is effected lie either parallel to the plane defined by the respective aperture opening or perpendicular to the plane. Other orientations of the rotation axes obliquely with respect to the directions illustrated are also possible, for example orientations of the rotation axis at 45° with respect to the directions illustrated.

Aperture devices in accordance with embodiments of the disclosure can also be arranged in such a way that the aperture elements pivoted into their engagement position lie in the region of single beam passage. FIGS. 4 and 5 illustrate, for clarification of single beam passage, rays—running in each case from left to right in an axially parallel fashion—of a ray bundle running between object plane and image plane of a projection objective. The rays of the open ray bundle have different ray angles at the location of the aperture device. In the region of single beam passage, the abovementioned vignetting problem often plays a subordinate or no part. It may be the case, however, that the optical properties of the system are designed in such a way that, although a planar object is imaged into a planar image plane, the associated pupil imaging has an image field curvature in the region of the pupil. In such a case, too, the use of a planar aperture when stopping down or stopping up would lead to the imaging quality being impaired, such that it may be expedient to provide an aperture device wherein the axial position of the effective aperture opening changes depending on the diameter of the effective aperture opening.

In the embodiments in FIGS. 4 and 5, this is realized by the use of aperture devices each having five aperture elements which are pivotable about a common rotation axis. Identical or similar parts or structures are designated by reference designations corresponding to those in the previous figures.

The aperture device APD in FIG. 4 has five aperture elements AE1, AE2, AE3, AE4 and AE5, which are pivotable about a common rotation axis RA with the aid of a common pivoting drive and which lie one above another in the manner of a stack of aperture elements in the engagement position shown. The first aperture element AE1 situated on the light entrance side and having the largest aperture opening is embodied in the form of a plane-parallel plate with a cutout forming the aperture opening. The other aperture elements each have a plate-shaped outer section and an inner section which delimits the aperture opening and which projects conically relative to the outer section somewhat in the direction of the next larger aperture opening. Unlike in the embodiments in accordance with FIGS. 1 and 2 or 6, however, the respectively smaller aperture openings, relative to the next larger aperture opening, lie on the same side as the associated outer section of the respective aperture element. What is thereby achieved is that the common surface CS defined by the aperture edges of the aperture elements pivoted into the engagement position has exactly the opposite sense of curvature in comparison with the corresponding common surface of the embodiments in FIGS. 1 and 2. By virtue of the conically fashioned inner section of the pivotable aperture elements, e.g. even in the case of large radii of curvature of the common spherical surface CS, each aperture element can be positioned with its aperture opening very accurately onto the spherical surface CA, wherein the thickness of the plate-shaped outer section of the apertures does not constitute a limiting parameter. Therefore, the aperture openings of different sizes can lie closer together relative to the direction AX than would correspond to the thickness of the outer sections of the aperture section.

As already mentioned, the effective aperture opening of the aperture device is in each case defined by the aperture opening of that aperture element which is folded into the engagement position and which has the smallest aperture opening. Given corresponding configuration of the aperture edge, that is to say of the light-determining edge of the aperture elements, such aperture devices can be incorporated into the beam path as desired in the illustrated orientation or in an opposite orientation, that is to say rotated by 180°. The orientation upon installation can be made dependent on the available structural space for the pivoting movement of the foldable aperture elements and the aperture curvature prevailing at the installation location.

Figure 7:
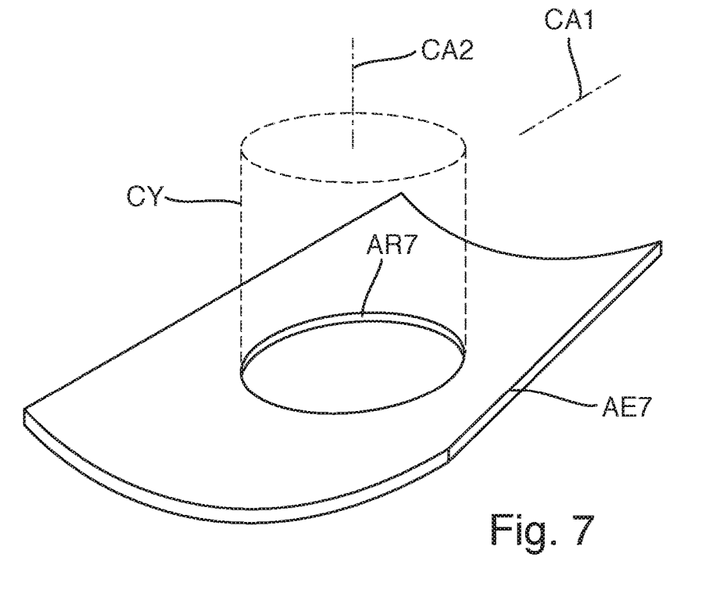
FIG. 7 shows an aperture element having an aperture opening whose aperture edge is curved in two mutually perpendicular planes.

In the examples shown, the aperture openings of the aperture elements are circular in each case and the aperture edge enclosing the aperture opening lies in a plane, that is to say is curved only in its circumferential direction. Neither property is mandatory, however. By way of example, the aperture element can be curved on itself in such a way that the aperture edge does not lie in a plane, but rather has curvatures in two mutually perpendicular planes. In this respect, FIG. 7 schematically shows the example of a plate-shaped aperture element AE7, which is curved substantially cylindrically about a first cylinder axis CA1. The aperture element has a round aperture opening AP7 enclosed by an aperture edge AR7. The aperture edge results as the intersection line of the cylinder defined by the first cylinder axis CA1 with a cylinder CY (illustrated in a dashed fashion) penetrating through it, the cylinder axis (second cylinder axis CA2) of the cylinder being perpendicular to the first cylinder axis. Consequently, the aperture edge lies firstly in the cylindrically curved surface defined by the aperture element AE7, and secondly in a cylindrical surface oriented perpendicularly to the axis of the cylindrically curved surface. As a result, the aperture edge is curved both in its circumferential direction and in planes parallel to the axis of the penetrating cylinder CY. This may be useful for example in the case of mirrors whose mirror surface corresponds to a freeform surface, that is to say to a non-rotationally symmetrical aspherical surface, in which the deviation of the actual mirror surface from a best matched spherical surface is significantly larger than the wavelength used.

Such aperture elements can be embodied as pivotable aperture elements, e.g. in the stated embodiments of the disclosure. However, they can also be used in systems without folding apertures. By way of example, such an aperture element can be mounted in a displaceable fashion parallel to the first cylinder axis CA1, such that an aperture change can be achieved by translational movement.

Figure 8:
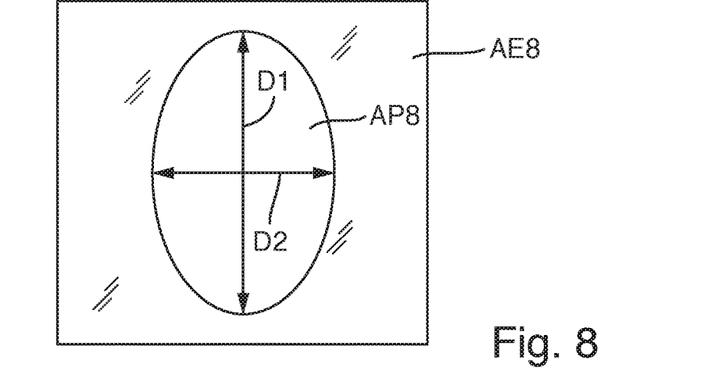
FIG. 8 shows an aperture element having an oval aperture opening.

FIG. 8 schematically shows the example of an aperture element AE8, whose aperture opening AP8 enclosed by the aperture edge AR8 has a non-round form deviating from the circular form, namely a substantially oval or elliptic form. Such non-round aperture openings may be useful particularly in the case of aperture devices arranged in front of a mirror that reflects a beam bundle incident on the mirror surface obliquely from one side obliquely in the direction of a downstream optical element. In the exemplary embodiment in FIG. 1, this situation is provided in front of the concave second mirror M2, which receives radiation from the first mirror M1 and reflects it in the direction of the third mirror M3, the reflective surface of which, relative to the optical axis OA, lies on the side lying opposite the reflective surface of M1. In this situation it may be favorable if the larger first diameter D1 of the non-round aperture opening lies in the illustrated meridional plane and the second diameter D2, which is smaller than D1, lies perpendicular to the plane, that is to say perpendicular to the plane of the drawing. The aperture opening can be dimensioned, in particular, in such a way that two rays of the ray bundle which are situated symmetrically with respect to an obliquely impinging principal ray of the ray bundle either both pass through the effective aperture opening in the outgoing and return paths or are both blocked out by the aperture element. Examples of such situations appertaining to the radiation course can be gathered from U.S. Pat. No. 7,221,516 B2, for example, the disclosure content of which is incorporated by reference in the content of the present description.

The aperture elements of the exemplary embodiments described above can in each case be embodied with a continuously curved, uninterrupted aperture edge, such that the aperture functions as a transmission filter with a rectangular transmission function wherein the transmission is maximal and constant over the entire aperture opening in the region of the aperture opening as is equal to zero in the region outside the aperture edge and a sharp transition between full transmission and full beam blocking is present at the aperture edge. This is not mandatory, however. An aperture element can be configured in the manner of a filter with any other filter function. By way of example, a transition region of greater or lesser width with a continuous decrease in the transition toward the outside can be present between the outer regions of full beam blocking and an inner region of full transmission. That can be achieved, for example, by equipping the aperture with a rim of inwardly directed serrations in the region of the aperture edge. In this respect, an aperture element can also be embodied as a filter with any non-rectangular transmission filter function.

The pivoting drives described in connection with FIGS. 1, 3 and 6 can furthermore be used to the effect that as an alternative or in addition to the aperture elements AE1, AE2, etc., filters, diffusing plates and/or diffractive or reflective optical elements can be brought from a neutral position outside the beam path into an engagement position that influences the optical beam path.

Figure 9:
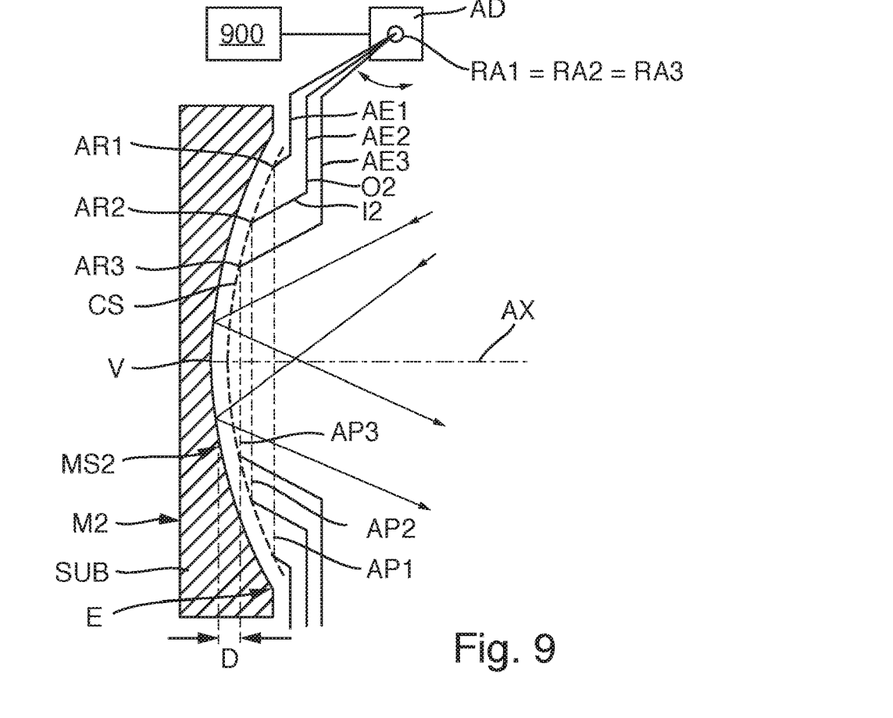
FIG. 9 shows an aperture device having aperture elements and a cooling device.

Those surfaces of the aperture elements which are swung into the beam path during stopping-down and are intended to block part of the radiation are designed in some embodiments as reflective surfaces, for example by applying a reflection coating that is effective for the EUV range. This makes it possible to prevent a partly irradiated aperture element from being undesirably heated to a great extent. Alternatively or additionally, the aperture device can be assigned a cooling device for the active cooling of the aperture elements. By way of example, the aperture elements can be pervaded by fluid channels which can be cooled with the aid of a cooling liquid conducted through. FIG. 9 depicts an aperture device with a cooling device 900 which cools the aperture elements.

Figure 10:
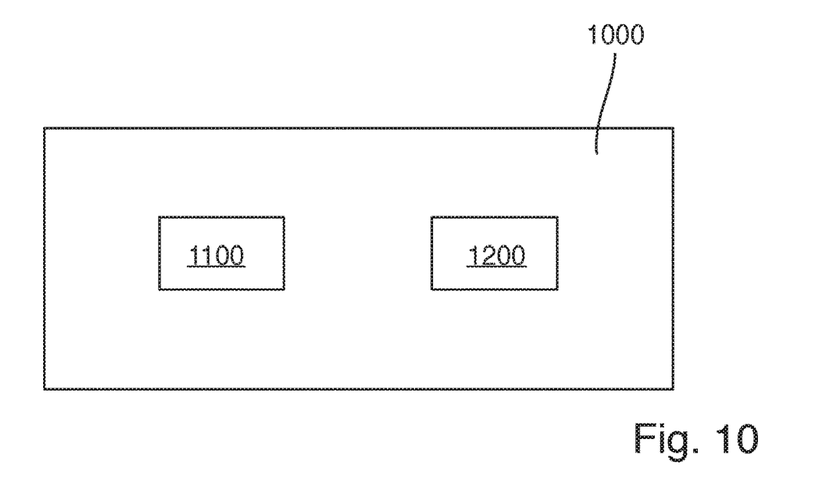
FIG. 10 shows a projection exposure apparatus.

FIG. 10 depicts a projection exposure apparatus 1000 including an illumination system 1100 and a projection objective 1200.

The invention claimed is:

1. An optical system, comprising:
an aperture device configured so that, when a ray bundle passes through the optical system along a beam path, the aperture device can variably delimit a cross section of the ray bundle, the aperture device comprising:
  a first aperture element pivotable about a first rotation axis between an engagement position in the beam path and a neutral position outside the beam path, the first aperture element having a first aperture opening delimited by an end of a first aperture edge; and
  a second aperture element pivotable about a second rotation axis between an engagement position in the beam path and a neutral position outside the beam path, the second aperture element having a second aperture opening delimited by an end of a second aperture edge,
wherein:
  the second aperture opening is smaller than the first aperture opening, and
  when the first aperture element is in its engagement position and the second aperture element is in its engagement position:

the first and second aperture elements form an effective aperture opening, and the entire end of the first aperture edge is offset from the entire end of the second aperture edge in a direction parallel to an optical axis of the optical system by an amount greater than a thickness of the first aperture element.

2. An optical system, comprising:

an aperture device configured so that, when a ray bundle passes through the optical system along a beam path, the aperture device can variably delimit a cross section of the ray bundle, the aperture device comprising:

a first aperture element pivotable about a first rotation axis between an engagement position in the beam path and a neutral position outside the beam path, the first aperture element having a first aperture opening delimited by an end of a first aperture edge; and a second aperture element pivotable about a second rotation axis between an engagement position in the beam path and a neutral position outside the beam path, the second aperture element having a second aperture opening delimited by an end of a second aperture edge, wherein:

the second aperture opening is smaller than the first aperture opening, when the first aperture element is in its engagement position and the second aperture element is in its engagement position:

the first and second aperture elements form an effective aperture opening, the entire end of the first aperture edge defines a first aperture plane, the entire end of the second aperture edge defines a second aperture plane, the first aperture plane is parallel to the second aperture plane, and the first aperture plane is offset from the second aperture plane.

3. The optical system of claim 2, wherein the first aperture plane is perpendicular to an optical axis of the optical system.

* * * * *

UNITED STATES PATENT AND TRADEMARK OFFICE
CERTIFICATE OF CORRECTION

PATENT NO. : 9,964,673 B2
APPLICATION NO. : 13/021583
DATED : May 8, 2018
INVENTOR(S) : Benjamin Sigel and Sascha Bleidistel

Page 1 of 1

It is certified that error appears in the above-identified patent and that said Letters Patent is hereby corrected as shown below:

In the Specification

Column 11, Line 2, delete "rather that that end" insert --rather than the end--.

Signed and Sealed this
Twenty-third Day of October, 2018

Andrei Iancu
*Director of the United States Patent and Trademark Office*